US006261727B1

(12) United States Patent
Wang

(10) Patent No.: US 6,261,727 B1
(45) Date of Patent: Jul. 17, 2001

(54) DOF FOR BOTH DENSE AND ISOLATED CONTACT HOLES

(75) Inventor: Chun-Ming Wang, Kaohsiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/473,030

(22) Filed: Dec. 28, 1999

(51) Int. Cl.[7] .............................. G03F 9/00; G03B 27/52

(52) U.S. Cl. .................................................. 430/5; 355/55

(58) Field of Search .......................... 430/5, 296; 355/55, 355/71, 77; 359/559; 250/205, 251

(56) References Cited

U.S. PATENT DOCUMENTS

| | | | | |
|---|---|---|---|---|
| 5,610,684 | | 3/1997 | Shiraishi | 355/55 |
| 5,663,785 | | 9/1997 | Kirk et al. | 355/71 |
| 5,691,803 | | 11/1997 | Song et al. | 355/55 |
| 5,863,712 | | 1/1999 | Von Bunau et al. | 430/396 |
| 6,118,516 | * | 9/2000 | Irie et al. | 355/53 |

FOREIGN PATENT DOCUMENTS

0562133A1 9/1993 (EP) .

OTHER PUBLICATIONS

Seiji Orii et al. "Quarter Micron Lithography System with Oblique Illumination and Pupil Filter", SPIE vol. 2197, pp. 854–857, 1994.

* cited by examiner

*Primary Examiner*—S. Rosasco
(74) *Attorney, Agent, or Firm*—George O. Saile; Stephen B. Ackerman

(57) ABSTRACT

A process and apparatus are described for a projection system having improved depth of focus. This has been achieved by introducing into a standard projection system, of the type suitable for photolithography, both a quadrupole mask in the pupil plane of the illuminator lens and a phase-type filter in the pupil plane of the projection lens. Detailed data for the design of both these filters is provided. If these guidelines are followed the result is a projection system whose depth of focus has been increased to a sufficient degree to allow the formation, in a single exposure, of a photoresist wafer suitable for simultaneously etching both isolated and densely packed contact holes.

20 Claims, 3 Drawing Sheets

DOF FOR BOTH DENSE AND ISOLATED CONTACT HOLES

FIELD OF THE INVENTION

The invention relates to the general field of photolithography with particular reference to the formation of photoresist masks suitable for use during simultaneous etching of both isolated and densely packed contact holes.

BACKGROUND OF THE INVENTION

Since the birth of the semiconductor industry, photolithography has been used for forming the various components that make up integrated circuits. The continued increase in the density of components that can be placed on a chip has been largely due to advances in photolithography associated with using radiation of ever decreasing wavelengths. As long as the minimum size (critical dimension) of the components was greater than the wavelength of the radiation being used to expose the photoresist, advances in the art did not require any changes in the masks used other than to reduce the sizes of the components.

Inevitably, a time came when the critical dimensions got to be less than about half the wavelength of the radiation being used, so radiation of lower wavelength had to be substituted. Eventually, critical dimensions reached, and then went below, the lower limit of optical lithography where conventional optics and resists can still be used (about 180 nm). Although it has been demonstrated that X-ray lithography is capable of producing patterns whose critical dimension is one or two orders of magnitude less than that, cost considerations have continued to drive conventional lithography to seek ways to image sub-optical critical dimensions while still using optical techniques.

When the wavelength of the imaging radiation gets to be larger than the critical dimension, the effects of diffraction, though always present, become prominent enough to introduce noticeable distortions into the images projected relative to their original shapes on the imaging mask. These distortions are particularly sensitive to the distances between the various features in the pattern and are therefore referred to as 'proximity effects'.

Another problem associated with photolithography at wavelengths close to the critical dimensions is depth of focus (DOF). In particular, when the DOF is less than the thickness of the resist being exposed, image sharpness will be lost. If light rays had no width, they would focus in a plane that was infinitely thin. In practice, because of diffraction effects, the best that can be achieved is a blur circle. As long as rays from the same point on the object are within the blur circle, they are considered to be in focus.

When resolution is not a problem, DOF can be increased by restricting the incoming light to the center of the lens. This then reduces the angle of the light cone so that focused rays travel further before leaving the blur circle. When resolution is also a consideration, this solution is no longer acceptable. One way to increase DOF without having to forego contributions from higher order diffraction maxima is to use off-axis illumination. This narrows the cone of illumination, thereby increasing DOF, while at the same time bringing more of the higher order diffraction maxima close to the center of illumination.

DOF of any particular object is, however, also affected by its proximity to other objects within the same pattern. The average degree of proximity between objects for a full pattern is conveniently expressed as a duty ratio which is defined as (total dark width)/(total clear width). Thus, DOF varies as a function of the duty ratio. The exact relationship between DOF and duty ratio is very complex but, most commonly, the higher the duty ratio (i.e. the more dark area), the greater the DOF.

Most prior art work to increase DOF has been directed towards patterns that are made up largely of lines, with the object of bringing isolated and densely packed lines simultaneously into focus (by increasing the DOF). The present invention is directed towards bringing both isolated and densely packed shapes that define contact holes into simultaneous focus. Because of the very complex nature of the optics that are involved, a solution that works for lines will not necessarily work for contact holes, and vice versa.

As it is an integral part of the present invention, it is important that we clarify our use of the term 'pupil plane'. In a lens system, a pupil plane is defined as one through which light from all parts of the object passes while being at the same time completely mixed, with no preferential special separation. In a projection system, the central plane of the lens itself meets this definition so is an example of a pupil plane. A stop inserted in front of the lens also meets this definition, forming an entrance pupil, while the image of the stop defines the plane of the exit pupil.

Referring now to FIG. 1, the basic components that make up a projection system for photolithography are schematically illustrated. Light beam 11 is condensed by illuminator lens 12 so that reticle 13, that includes feature 19, is uniformly illuminated. Most of the original beam passes straight on as the zero order diffraction maximum 14, while first order diffraction maxima 15 and higher order maxima 16 are diffracted off to the side. These are then focused by projection lens 17 onto focal plane 18. Since no information (other than overall brightness) is contained in the zero order maximum, it is imperative that at least some of the higher order beams contribute to the image. This necessarily widens the angle of the focusing cone resulting, as seen above, in a reduced DOF.

In FIG. 2, the basic setup of FIG. 1 has been modified so that light beam 11 is blocked from the center of illuminator lens 12, being limited to coming in obliquely (off-axis). The result of this is that the zero order diffraction maximum 14 is forced over to the edge of projection lens 17 while $1^{st}$ order maximum 15 passes (approximately) through the center of the projection lens, thereby allowing a narrower angle for the focusing cone, with a corresponding increase in DOF.

In FIG. 3, a different modification of the basic setup of FIG. 1 has been introduced. This is the placement of phase-type filter 31 at the pupil plane of the projection lens 17. Its effect is to change the phase of the first and higher order diffraction maxima by 180° relative to that of the zero order maximum 14. This results in an increase of DOF for dense patterns.

A routine search of the prior art was conducted but no prior art that provides the precise solution (to the problem of simultaneously imaging both dense and isolated contact hole shapes) was encountered. Several references of interest were, however, found. For example, in U.S. Pat. No. 5,691,803 Song et al. show a system in which both quadrupole and annular illumination is used while in U.S. Pat. No. 5,663,785 Kirk et al. show a modified pupil filter that provides a spinning diffraction filter placed in a stepper to provide annular illumination on a time averaged basis.

In U.S. Pat. No. 5,863,712 Von Bunau et al. show a pupil filter with a variable amplitude transmittance while Shiraishi, in U.S. Pat. No. 5,610,684, shows an exposure system with an optical correction plate that differs from that of the invention. This patent provides a description of the commercially available Nikon Shrinc filter. In a paper entitled "Quarter micron lithography system with oblique illumination and pupil filter" (SPIE vol. 2197 pp. 854–857 1994) Orii et al. conclude that if oblique illumination is to be used in conjunction with a pupil filter, then dipole illumination should be used. In a European patent (0 562 133 A1) Sandström that off-axis illumination should be optimized for line patterns that run at a 45° angle relative to the bulk of the wiring.

SUMMARY OF THE INVENTION

It has been an object of the present invention to provide a process for producing, in a single exposure, a photoresist wafer suitable for etching contact holes that are both isolated as well as densely packed.

Another object of the invention has been to provide a projection system that operates according to said process.

These objects have been achieved by introducing into a standard projection system, of the type suitable for photolithography, both a quadrupole mask in the pupil plane of the illuminator lens and a phase type filter in the pupil plane of the projection lens. Detailed data for the design of both these filters are provided. If these guidelines are followed the result is a projection system whose depth of focus has been increased to a sufficient degree to allow the formation, in a single exposure, of a photoresist wafer suitable for simultaneously etching both isolated and densely packed contact holes.

DESCRIPTION OF THE PREFERRED EMBODIMENTS

As discussed earlier, DOF is an important parameter in imaging systems used for photolithography because of the need to expose the full thickness of the photoresist. In the prior art it has been standard practice to have good DOF control for either densely packed features or for isolated features, but not for both. It may also be necessary to take into consideration the orientation of the features being imaged, such as the direction in which lines run.

Figure 3:
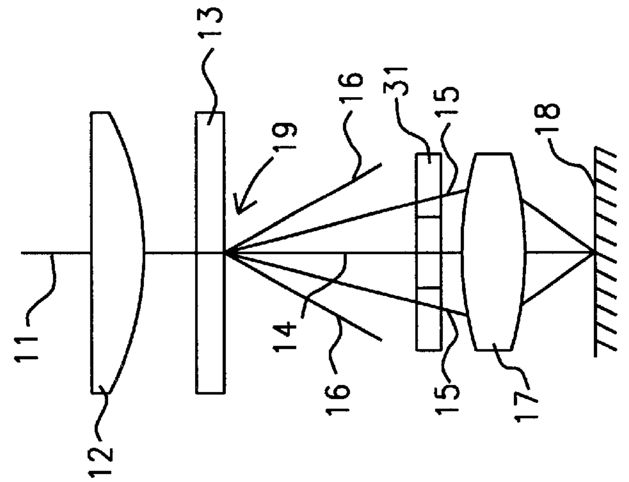
FIG. 3 is a modification of FIG. 1 in which a phase-type pupil filter has been introduced.
Figure 2:
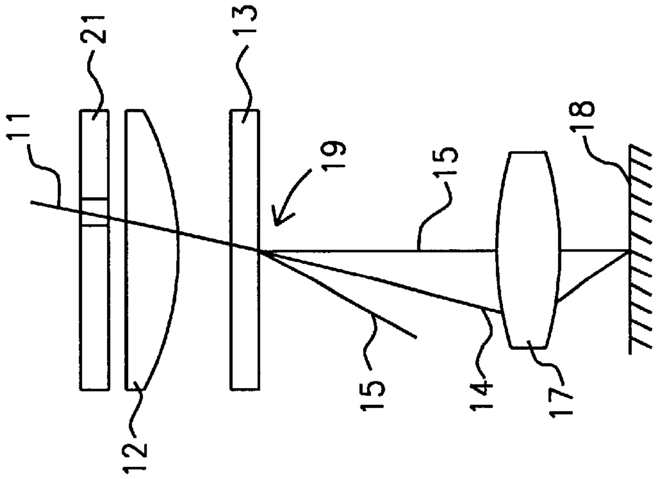
FIG. 2 is a modification of FIG. 1 in which off-axis illumination has been introduced.
Figure 4:
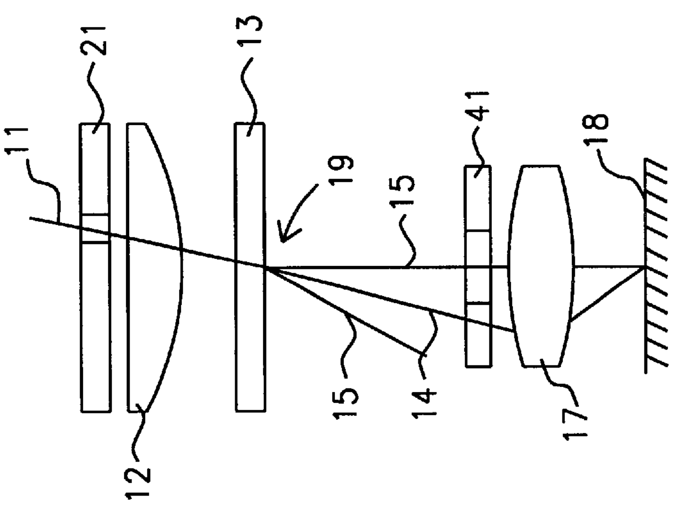
FIG. 4 shows the projection system disclosed under the present invention.

The process of the present invention starts with the provision of a suitable projection system, including a projection lens as well as a condenser or illuminator lens. Referring now to FIG. 4, we show a projection system similar to those seen earlier in FIGS. 2 and 3 but with the added feature that both a phase-type pupil filter 41, located at (or as near as possible to) the pupil plane of the projection lens 17, and a quadrupole filter 42, located at (or as near as possible to) the pupil plane of the illuminator lens 12, are added to the system.

As with the systems of the prior art, reticle 13 is placed between the two filters in the object plane of the projection lens. The reticle bears a pattern that is to be imaged onto, and below, plane 18 which would normally be the upper surface of a layer of photoresist. It is important to note that, as a key feature of the invention, this pattern includes shapes that define both densely packed and isolated contact holes. By 'isolated' hole shapes we imply shapes that are separated by at least 0.54 microns from all other shapes in the image (0.18micron process) while 'densely packed' refers to shapes are separated from each other by, on average, between about 0.18 and 0.36 microns (0.18 micron process).

Another key feature of the invention is the choice of parameters that characterize the two filters that have been inserted into the optical path of the system. If the filters are personalized with values that fall outside the ranges we quote below, the system will not be able to achieve a depth of focus that is as large as between about 0.4 and 0.6 microns (at a wavelength of about 248 nm. Independent of focal length).

Figure 5:
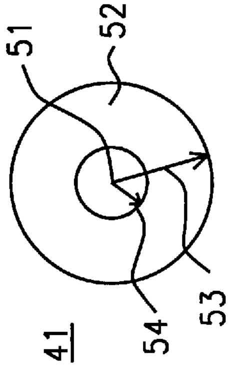
FIG. 5 is a plan view of a phase-type filter of the kind used by the present invention.

Referring now to FIG. 5, we show a plan view of phase-type pupil filter 41. This filter is composed of a central circular region 51 surrounded by annular region 52. The thicknesses and/or refractive indices of materials that comprise these two regions are such that the light transmitted through annular region 52 is 180° out of phase with light transmitted through circular region 51. The relative dimensions of the two regions must be such that circular region 51 has a radius 54 that is 0.42× the outer radius 53 of the filter (i. e. of the annular region).

Figure 6:
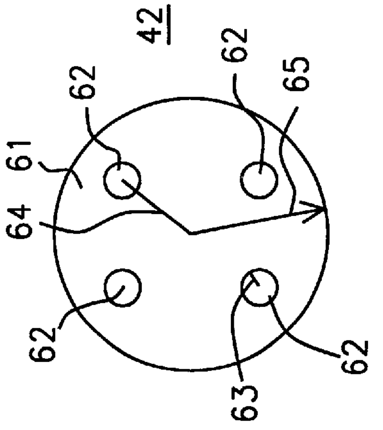

FIG. 6 is a plan view of the quadrupole filter. This is an opaque circle within which are four clear circular areas 62 that are symmetrically arranged to lie at the four comers of a (virtual) square. The orientation of the opening 62 relative to the major features in the pattern being imaged is important. Thus, they are placed so that all horizontal and vertical arrays of holes have good DOF. The relative dimensions of the circle 61 and the clear areas 62 must be such that the radius 63 of each clear region is between about 0.15 and 0.3× the radius 65 of the filter and the center of each clear area is located a distance 64 that is between about 0.6 and 0.8× the radius 65 of the filter.

Figure 7:
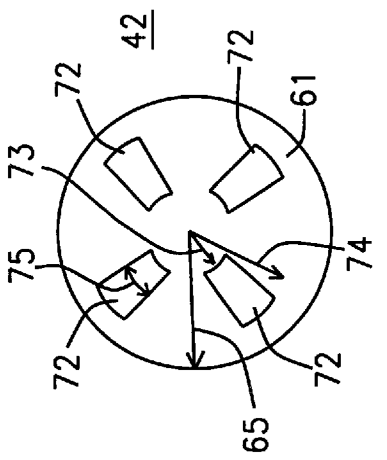
FIGS. 6 and 7 are plan views of quadrupole filters used by the present invention.

In FIG. 7 we show, also in plan view, an alternative embodiment of the illuminator filter. As before, the filter is an opaque circle 61 within which are four clear areas 72 that are symmetrically arranged to lie at the four corners of a (virtual) square. Instead of being circles, however, the clear areas 72 are annular sectors. The relative dimensions of the circle 61 and each of the annular sectors 72 must be such that the inner radius 73 of each annular sector 72 is between about 0.25 and 0.4× the radius 65 of the filter and the outer radius 74 of each annular sector 72 is between about 0.6 and 0.85× the radius 65 of the filter. Each annular sector 72 sweeps out an angle that is between about 25 and 45 degrees of arc. The orientation of the annular sectors 72 relative to the major features in the pattern being imaged is important. Thus, they are placed so that they work for horizontal and vertical arrays.

Figure 1:
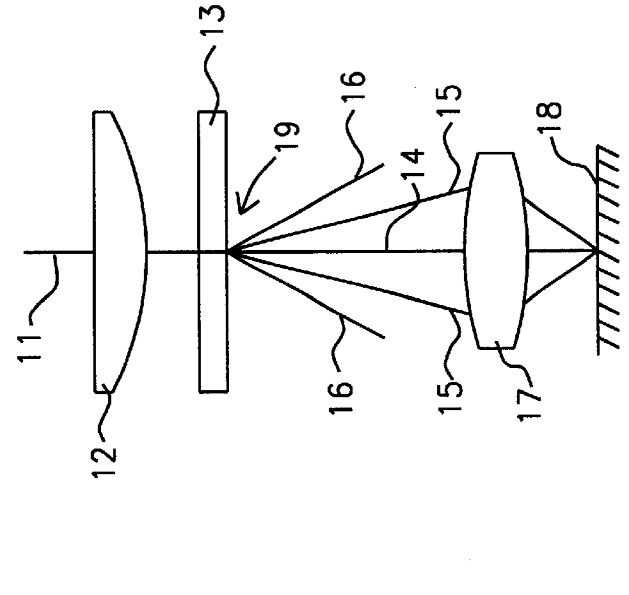
FIG. 1 is a schematic illustration of a projection system used in photolithography.
Figure 8:
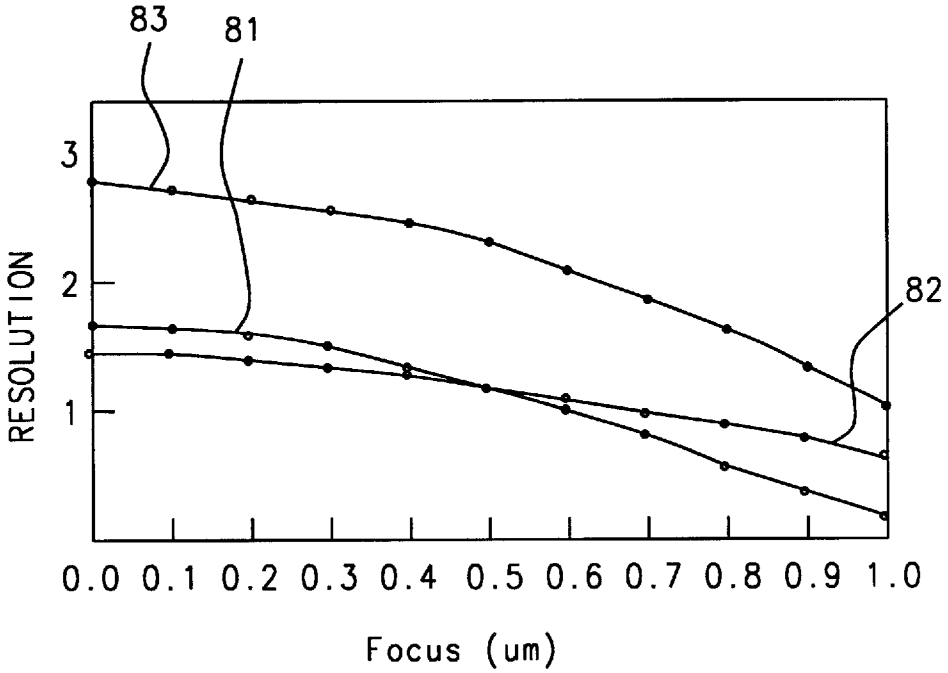
FIGS. 8 and 9 are curves of resolution vs. focal distance comparing the effectiveness of prior art systems with the present invention.
Figure 9:
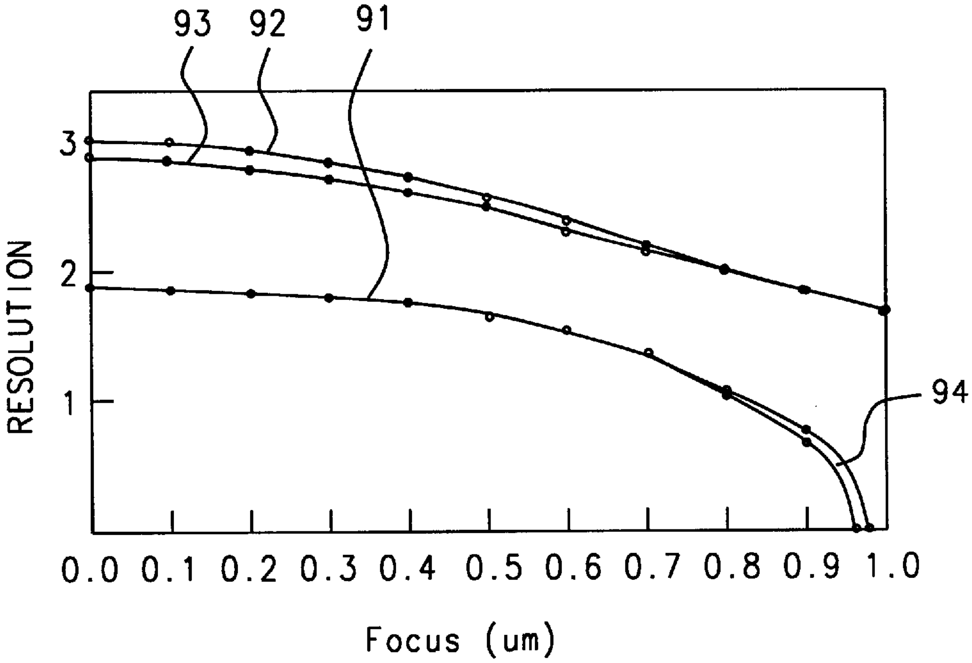

If the procedure and dimensional control described above are adhered to, an improvement in DOF will be obtained that enables both densely packed and isolated hole shapes to be imaged in photoresist simultaneously. Supporting evidence for this is shown in FIGS. 8 and 9. FIG. 8 plots the normalized log slope (NLS) as a function of the distance, in microns, at which the best focus was obtained for an image made up primarily of isolated features. Curve 81 is for the case when no filters were used (corresponding to the arrangement shown in FIG. 1). Curve 82 is for the case when only a quadrupole filter was used (corresponding to the arrangement shown in FIG. 2). Curve 83 is for the case when both lens pupil and illuminator pupil filters were used (as shown in FIG. 4). As can be seen, the resolution is higher (and exceeds 2.3) and remains almost flat out to 0.4 microns, FIG. 9 plots the normalized log slope of the aerial image as a function of the distance, in microns, at which the best focus was obtained for an image made up primarily of densely packed features. Curve 91 is for the case when no filters were used (corresponding to the arrangement shown in FIG. 1). Curve 92 is for the case when only a quadrupole filter was used (corresponding to the arrangement shown in FIG. 2) while curve 94 is for the case when only a lens pupil filter was used (corresponding to the arrangement shown in FIG. 3). Curve 93 is for the case when both lens pupil and illuminator pupil filters were used (as shown in FIG. 4). While the resolution is very slightly lower than for curve 92, it is flatter than curve 92 again implying an improved depth of focus.

While the invention has been particularly shown and described with reference to the preferred embodiments thereof, it will be understood by those skilled in the art that various changes in form and details may be made without departing from the spirit and scope of the invention.

What is claimed is:

1. A process for improving depth of focus in an image containing shapes for both densely packed and isolated contact holes, comprising:

providing an imaging system for photolithography including a projection lens having a first pupil plane, an illuminator lens having a second pupil plane, and a focal plane;

placing a phase-type pupil filter at the first pupil plane;

placing a quadrupole filter at the second pupil plane;

between the two pupil planes, placing a reticle having a pattern that includes said shapes of both the dense and the isolated contact holes; and then using said imaging system to form images, of both the isolated and the densely packed hole shapes, that are in focus simultaneously on the focal plane.

2. The process of claim 1 wherein the depth of focus is between about 0.4 and 0.6 microns.

3. The process of claim 1 wherein the phastype pupil filter further comprises a circular region surrounded by an annular region, having an outer radius, whose transmission of light is 180° out of phase relative to light transmitted through the circular region.

4. The process of claim 3 wherein the circular region has a radius that is 0.42× the outer radius of the annular region.

5. The process of claim 1 wherein the quadrupole filter is a circle having a center and further comprises four clear circular areas symmetrically disposed within an opaque area, said clear areas being located at the comers of a square and oriented so as to be good for horizontal and vertical arrays.

6. The process of claim 5 wherein each circular region has a radius that is between about 0.15 and 0.3× the radius of the filter and a center that is located between about 0.6 and 0.8× the radius of the filter from the center of the filter.

7. The process of claim 1 wherein the quadrupole filter is a circle having a center and further comprises four clear areas each of which is an annular sector, symmetrically disposed within an opaque area, said clear areas being located at the corners of a square and oriented to work for horizontal and vertical arrays.

8. The process of claim 7 wherein each annular sector has an inner radius that is between about 0.25 and 0.4× the radius of the filter and an outer radius that is between about 0.6 and 0.85× the radius of the filter and wherein each annular sector sweeps out an angle that is between about 25 and 45 degrees of arc.

9. The process of claim 1 wherein the isolated hole shapes are separated by at least 0.54 microns from all other shapes in the image.

10. The process of claim 1 wherein the densely packed hole shapes are separated from each other by, on average, between about 0.18 and 0.36 microns.

11. A process for improving depth of focus during exposure of a layer of photoresist for the formation of a mask suitable for simultaneously etching both densely packed and isolated contact holes, comprising:

providing an imaging system for photolithography including a projection lens having a first pupil plane and an illuminator lens having a second pupil plane;

placing a phase-type pupil filter at the first pupil plane;

placing a quadrupole filter at the second pupil plane;

between the two pupil planes, placing a reticle having a pattern that includes shapes for both the dense and the isolated contact holes;

then using said imaging system to form images, of both the isolated and the densely packed hole shapes, that are in focus simultaneously at the photoresist, thereby exposing the photoresist; and then developing the photoresist to form patterns on wafers.

12. The process of claim 11 wherein the depth of focus is between about 0.4 and 0.6 microns.

13. The process of claim 11 wherein the phase-type pupil filter further comprises a circular region surrounded by an annular region, having an outer radius, said circular region having a radius that is 0.42× the outer radius of the annular region, and wherein transmission of light through the annular region is 180° out of phase relative to light transmitted through the circular region.

14. The process of claim 11 wherein the quadrupole filter is an opaque circle, having a center and a radius, and further comprises four clear circular areas symmetrically disposed within the opaque area, said clear areas being located at the corners of a square and oriented to work for horizontal and vertical lines and wherein each circular region has a radius that is between about 0.15 and 0.3× the radius of the filter and a center that is located between about 0.6 and 0.8× the radius of the filter from the center of the filter.

15. The process of claim 11 wherein the quadrupole filter is an opaque circle, having a center and a radius, and further comprises four clear areas each of which is an annular sector, symmetrically disposed within the opaque area, said clear areas being located at the comers of a square and oriented to work for horizontal and vertical arrays whereby the sides of the square are parallel to the direction of any wiring in the pattern and wherein each annular sector has an inner radius that is between about 0.25 and 0.4× the radius of the filter and an outer radius that is between about 0.6 and 0.85× the radius of the filter and wherein each annular sector sweeps out an angle that is between about 25 and 45 degrees of arc.

16. An apparatus for improving depth of focus during exposure of a layer of photoresist for the formation of a mask suitable for simultaneously etching both densely packed and isolated contact holes, comprising:

an imaging system for photolithography including a projection lens having a first pupil plane and an illuminator lens having a second pupil plane;

a phase-type pupil filter located at the first pupil plane;

a quadrupole filter located at the second pupil plane; and between the two pupil planes, a reticle having a pattern that includes shapes for both the dense and the isolated contact holes.

17. The apparatus described in claim 16 wherein the pupil filter further comprises a circular region surrounded by an annular region, having an outer radius, whose transmission of light is 180° out of phase relative to light transmitted through the circular region and wherein the circular region has a radius that is 0.42× the outer radius of the annular region.

18. The apparatus described in claim 16 wherein the quadrupole filter is a circle, having a center and a radius, and further comprises four clear circular areas symmetrically disposed within an opaque area, said clear areas being located at the corners of a square and oriented to work for horizontal and vertical arrays whereby the sides of the square are parallel to the direction of any wiring in the pattern and wherein each circular region has a radius that is between about 0.15 and 0.3× the radius of the filter and a center that is located between about 0.6 and 0.8× the radius of the filter from the center of the filter.

19. The apparatus described in claim 16 wherein the quadrupole filter is a circle having a center and a radius and further comprises four clear areas each of which is an annular sector, symmetrically disposed within an opaque area, said clear areas being located at the corners of a square and oriented to work for horizontal and vertical arrays whereby the sides of the square are parallel to the direction of any wiring in the pattern.

20. The apparatus described in claim 19 wherein each annular sector has an inner radius that is between about 0.25 and 0.4× the radius of the filter and an outer radius that is between about 0.6 and 0.85× the radius of the filter and wherein each annular sector sweeps out an angle that is between about 25 and 45 degrees of arc.

* * * * *